United States Patent [19]

Itoh et al.

[11] 4,148,655
[45] Apr. 10, 1979

[54] PHOTOSENSITIVE COMPOSITION OF AROMATIC AZIDO COMPOUND

[75] Inventors: Hirosi Itoh; Yukinori Hata; Fumio Itoh, all of Tokyo, Japan

[73] Assignee: Oji Paper Co., Ltd., Japan

[21] Appl. No.: 861,348

[22] Filed: Dec. 16, 1977

[30] Foreign Application Priority Data

Apr. 20, 1977 [JP] Japan .................................. 52-44588

[51] Int. Cl.$^2$ .............................................. G03C 1/52
[52] U.S. Cl. ....................................... 96/91 N; 96/49; 96/91 D
[58] Field of Search ........................ 96/91 N, 91 D, 49

[56] References Cited

U.S. PATENT DOCUMENTS

| 2,937,085 | 5/1960 | Sevew et al. .................... 96/91 N |
| 3,567,453 | 3/1971 | Borden ............................ 96/91 N |
| 3,595,656 | 7/1971 | Ruckert et al. ..................... 96/49 |

FOREIGN PATENT DOCUMENTS

2029705  1/1973  Fed. Rep. of Germany .......... 96/91 N

OTHER PUBLICATIONS

Kirk-Othmer; Encyclopedia of Chemical Technology; 2nd Ed.; vol. 15, 1968, pp. 182–185.

*Primary Examiner*—Edward C. Kimlin
*Assistant Examiner*—Alfonso T. Suro Picó
*Attorney, Agent, or Firm*—Paul & Paul

[57] ABSTRACT

Disclosed is an alkali-soluble photosensitive composition having an excellent stability in photosensitivity and developing property over a long storage time and a high ink-sensitivity. The composition comprises an aromatic azido compound and a novolak resin prepared by condensation polymerizing, in the presence of an acid catalyst, formaldehyde, a phenol compound of the following formula (I) and another phenol compound or compounds of the following formula (II) and/or formula (III).

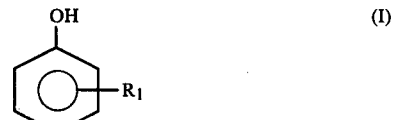

(I)

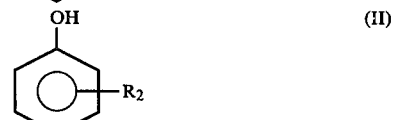

(II)

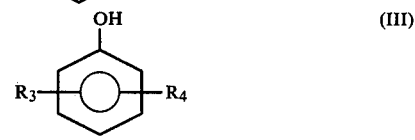

(III)

wherein, $R_1$=H or —$CH_3$, $R_2$=alkyl of 3–15 carbon atoms, phenyl or cyclohexyl, and $R_3$ and $R_4$=alkyl of 1–3 carbon atoms.

5 Claims, No Drawings

PHOTOSENSITIVE COMPOSITION OF AROMATIC AZIDO COMPOUND

DETAILED DESCRIPTION OF THE INVENTION

The present invention relates to a photosensitive composition. More particularly, the present invention relates to a photosensitive composition which is soluble in an alkali aqueous solution and which can be converted into a hardened resin having a very high resistance to an alkali aqueous solution when exposed to actinic rays.

It is known that a photosensitive composition comprising an aromatic azido compound and a high molecular compound having a phenolic hydroxyl radical, for example, phenol novolak resins and cresol novolak resins which have a relatively small molecular weight and are soluble in an alkali aqueous solution, are useful for providing a lithographic, relief or intaglio printing material or a photoresist for etching a metal article in accordance with a desired pattern. Recently, it has been known that linear vinyl polymers having hydroxyl groups, for example, hydroxypolystyrene can be utilized as a component of the photosensitive composition for the same use as mentioned above. Those known photosensitive compositions are coated on a surface of a base material. The coating layer thus formed is exposed to actinic rays, in accordance with a desired pattern of images, and treated with a developing liquid, for example, an alkali aqueous solution, to eliminate the non-exposed portion of the coating layer. However, in the case where the above-mentioned types of known photosensitive compositions are used, there is a disadvantage in that the difference, in solubility in the alkali developing liquid, between the exposed portion and the non-exposed portion of the photosensitive coating layer, is relatively small, and therefore, it is difficult to control the developing operation so as to obtain clearly developed images. Particularly, in the case where the coating layer of the known photosensitive composition is continuously developed, the developing operation is troublesome, because the concentration of the alkali in the developing liquid and the developing time should be accurately adjusted to predetermined values. Further, the printing plate produced by using the above-mentioned known photosensitive compositions has a disadvantage of relatively poor fat-sensitivity to printing ink.

Japanese Patent Application Publication No. 48-43284 discloses that a composition containing an azido compound and a condensation polymer of cardanol, anacardol or cardol, which are obtained from cashew nut oil, phenol and formaldehyde, has a good photosensitivity. The above-mentioned cardanol, anacardol or cardol is a phenol derivative having an alkenyl radical as a side chain which contains 15 carbon atoms and has one or more double bonds. Accordingly, a novolak resin containing the above-mentioned phenol derivative has a high photo-hardening property due to the high reactivity of the double bond located in the side chain. However, the photosensitive composition containing the above-mentioned type of novolak resin has a disadvantage in that the composition has a tendency of deteriorating in quality during long storage due to the high reactivity of the double bond. Therefore, when the photosensitive composition is coated on a base material surface to form a photosensitive layer and, then, stored for a long period of time, the solubility of the photosensitive layer in the alkali aqueous solution is reduced with the lapse of the storing time. Therefore, if the photosensitive layer is used after a long period of storage, the time necessary to completely dissolve away the non-exposed portion of the photosensitive layer is undesirably long. If the storage time is very long, the difference in solubility in the alkali aqueous solution between the exposed portion and the non-exposed portion of the photosensitive layer is reduced to such an extent that the photosensitive layer can not be practically utilized.

An object of the present invention is to provide a photosensitive composition which can be converted into a hardened resin having a very high resistance to an alkali aqueous solution by being exposed to actinic rays for a short time, and which also can be rapidly developed in a short time.

Another object of the present invention is to provide a photosensitive composition which has a high stability in photosensitivity and developing property even after long storage.

A further object of the present invention is to provide a photosensitive composition which is capable of forming a printing plate material having a high ink-sensitivity.

The above-mentioned objects can be attained by the photosensitive composition of the present invention, which comprises at least one aromatic azido compound and at least one polymer which is soluble in an alkali aqueous solution and which polymer has been prepared by condensation polymerizing, in the presence of an acid catalyst, formaldehyde; a phenol compound of the formula (I):

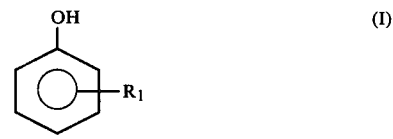

wherein $R_1$ represents a hydrogen atom or a methyl radial, and; at least one other phenol compound selected from those of the formulae (II) and (III):

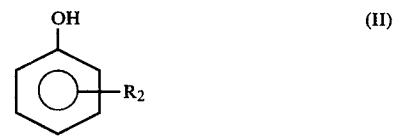

and

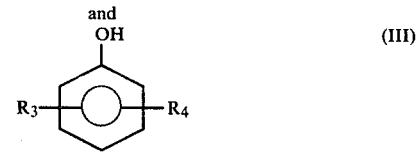

wherein, $R_2$ represents an alkyl radical having 3 to 15 carbon atoms, a phenyl radical or a cyclohexyl radical and $R_3$ and $R_4$ represent an alkyl radical having 1 to 3 carbon atoms, respectively.

The polymer which is contained in the photosensitive composition of the present invention and is soluble in the alkali aqueous solution, is characterized by containing, as indispensable condensation components, both the phenol compound of the formula (I), having a relatively small molecular weight, and the other phenol compound or compounds selected from those of the formulae (II) and (III) and having a relatively large molecular weight. The constitution of the polymer may be designed in response to the required properties of the polymer, for example, the developing property with the alkali developing liquid.

Generally, it is preferable that the ratio by weight of the phenol compound of the formula (I) to the other phenol compound or compounds selected from those of the formulae (II) and (III) be in a range of from 90:10 to 30:70, and the amount of the formaldehyde be in a range of from 50 to 90% by mole, based on the total amount of the phenol compound of the formula (I) and the other phenol compound or compounds selected from those of the formulae (II) and (III).

In the photosensitive composition of the present invention, the phenol compound of the formula (I) may be either phenol or cresol. The other phenol compound of the formula (II) may be selected from phenylphenol, cyclohexylphenol, isopropylphenol, p-tert-butylphenol, p-n-butylphenol, p-tert-amylphenol, p-n-amylphenol, p-tert-octylphenol, p-n-octylphenol, p-nonylphenol, p-dodecylphenol, hexylphenol and m-pentadecylphenol. The other phenol compound of the formula (III) may be selected from 2,4-xylenol, 3,4-xylenol, 3,5-xylenol, carvacrol and thymol.

The compounds of the formulae (I), (II) and (III) and formaldehyde can be condensation polymerized in the presence of an acid catalyst, for example, hydrochloric acid, oxalic acid, zinc acetate and magnesium acetate, which are conventionally utilized for the production of conventional phenolic resins, to prepare a new novolak resin which is soluble in the alkali aqueous solution. The condensation polymerization mentioned above may be effected by any methods which are known to be useful for the production of the conventional novolak resins.

The aromatic azido compounds to be contained in the photosensitive composition of the present invention are not restricted to a special group, as long as the azido compounds have a (—N₃) moiety and can be utilized as a photosensitive component of the conventional photosensitive compositions. The aromatic azido compound is preferably selected from 4,4'-diazidostilbene, 4,4'-diazidochalcone, 4,4'-diazidobenzophenone, 2,6-bis(4'-azidobenzylidene)cyclohexanone, 1-azidopyrene, 1,6-diazidopyrene, 2-(4'-methoxyanilino)-5-azidobenzoic methyl ester, 2-anilino-5-azidobenzoic acid, 2-(4'-azidophenol)-6-methyl benzothiazole and 2-(4'-azidophenyl)-(naphtho-1',2'-4,5-oxazole).

The content of the aromatic azido compound in the photosensitive composition of the present invention may be adjusted to a desired value in response to the use of the photosensitive composition. However, generally, it is preferable that the content of the aromatic azido compound is in a range of from 5 to 40%, more preferably, from 10 to 30%, based on the weight of the polymer to be contained in the photosensitive composition.

The preparation of the photosensitive element by using the photosensitive composition of the present invention can be carried out as follows.

The photosensitive compound is dissolved in a proper organic solvent, for example, an ethyleneglycol ether, ethyleneglycol acetate, cyclohexanone, carbitol, dioxane, butyl acetate or an aliphatic lower alcohol, to prepare a solution having, preferably, a concentration of from 1 to 30% by weight. The solution thus prepared is evenly applied onto a surface of a proper supporting material, for example, a metal plate such as aluminium, zinc or copper plate; a plastic film or plate such as, polyester, polypropylene, cellulose acetate film or plate; paper; or, a laminate of paper with one or more of the above-mentioned plates and films, to form a photosensitive layer having a desired thickness. The method for applying the solution to the supporting material is not limited to a special method, and may be a spray method, dipping method, or coating method using a coating whirler or roller. After the application of the solution onto the supporting material surface, the resulting solution layer is dried by evaporating the organic solvent therefrom.

A negative film having a predetermined pattern is superimposed on the resultant photosensitive layer, and exposed to actinic rays. As a source of actinic rays, a carbon arc lamp, mercury lamp or xenon lamp can be used. By this exposure, the exposed portion of the photosensitive layer is hardened and insolubilized in the alkali aqueous solution.

The thus exposed photosensitive layer is developed with an alkali developing liquid, for example, an aqueous solution of sodium metasilicate, sodium hydroxide, potassium hydroxide, sodium carbonate, trisodium phosphate alone or a mixture of two or more of the above-mentioned compounds. The alkali aqueous solution may contain therein an organic solvent, for example, methyl alcohol, ethyl alcohol, and dioxane, or conventional anionic or non-ionic surface active agent, as an auxiliary developing agent, if desired.

The conditions under which the exposure and the development are carried out are selected in response to the required number of the remaining steps of the Step-Tablet No. 2 made by Eastman Kodak Co. Usually, the development is carried out at a temperature of from 20° to 35° C., for from 45 seconds to 2 minutes.

The photosensitive composition of the present invention can contain, in addition to the above-specified novolak resin, one or more conventional phenolic resins, modified phenolic resins and other polymeric resins, as long as those resins are soluble in an alkali aqueous solution, and also, can be hardened and insolubilized in the alkali aqueous solution when exposed to actinic rays in the presence of the aromatic azido compound. Also, the photosensitive composition of the present invention may contain therein an additive which is effective for enhancing the coating property of the photosensitive composition solution and, also, effective for increasing the mechanical strength of the resultant photosensitive layer. The additive mentioned above can be selected from, for example, cellulose derivatives, acrylic polymers, polyvinyl pyrrolidone and maleic acid copolymers. Further, the photosensitive composition of the present invention may contain a dye, pigment, photosensitizer and other additives.

The photosensitive layer prepared by using the photosensitive composition of the present invention has a very high sensitivity to actinic rays and can be converted into a rigid film layer of hardened resin having an excellent resistance to an alkali aqueous solution. Accordingly, the utilization of the photosensitive composition of the present invention can cause the exposure time required to completely harden the photosensitive layer to be remarkably shortened, compared with that of the conventional photosensitive compositions. Also, since in the photosensitive layer prepared by using the photosensitive composition of the present invention, the difference in solubility in the alkali aqueous solution between the exposed portion and the non-exposed portion is extremely large, the development of the photosensitive layer with the alkali aqueous solution can be performed rapidly and the resultant developed images are very sharp.

The photosensitive composition of the present invention and the photosensitive material prepared by using the same has a high chemical stability, and therefore, can be stored without deterioration of the quality thereof over a long period of time.

In addition to the above-mentioned properties, the hardened photosensitive layer has an excellent ink-sensitivity. Accordingly, the photosensitive composition of the present invention can be utilized as a photosensitive material to provide various printing materials, for example, lithographic relief and intaglio printing materials.

The hardened photosensitive layer obtained from the photosensitive composition has a high resisntance to an etching solution for metal articles. Therefore, the photosensitive composition of the present invention can be used as a photoresist to provide a photomask and mask for etching a metal article in accordance with a desired pattern. The photosensitive composition of the present invention is also useful for providing a second original sheet of a drawing to be used for the duplication.

The process for producing the polymer (novolac resin), which is soluble in an alkali aqueous solution and which is usable for the photosensitive composition of the present invention, will be illustrated by the following referential examples.

REFERENTIAL EXAMPLES 1 THROUGH 7

In Referential Example 1, a one liter three-neck flask, provided with a sealed stirrer, condenser and thermometer, was charged with the following mixture.

| Composition of the mixture | |
|---|---|
| A Phenol | 3.2 mole |
| B p-tert-Octylphenol | 1.5 mole |
| C Formaldehyde (37% concentration) | 3.9 mole |
| D Hydrochloric acid (35% concentration) | 0.47 ml |
| B/(A + B) = 50% by weight | |

The mixture in the flask was heated to a temperature of 100° C. and maintained at this temperature for 8 hours, while being stirred, to prepare a novolak resin. Thereafter, the reaction mixture was heated to a temperature of from 180° to 190° C. under a reduced pressure to eliminate non-reacted formaldehyde and phenol compounds and water from the reaction mixture. 540 g of the novolak resin was obtained. This resin had a melting point of from 96° to 100° C.

In each of Referential Examples 2 through 7, procedures identical to those carried out in Referential Example 1 were repeated, except that the p-tert-octylphenol in the above-mentioned amount is replaced by a phenol compound an amount indicated in Table 1. The melting point of the resultant novolak resin is also indicated in Table 1.

Table 1

| Ref. Ex. No. | Phenol compound A | B | B/(A + B)(%) | Melting point of novolak resin (° C.) |
|---|---|---|---|---|
| 1 | Phenol | p-tert-octylphenol | 50 | 90–95 |
| 2 | " | m-pentadecylphenol | 20 | 85–90 |
| 3 | m-cresol | p-tert-butylphenol | 58 | 101–106 |
| 4 | Phenol | p-nonylphenol | 50 | 90–96 |
| 5 | " | p-tert-amylphenol | 60 | 95–101 |
| 6 | " | 3.5-xylenol | 63 | 96–103 |
| 7 | " | p-phenylphenol | 53 | 98–104 |

The present invention will be illustrated by the following examples, which are provided for the purpose of illustration and should not be interpreted as in any way limiting the scope of the present invention.

EXAMPLES 1 THROUGH 6 AND COMPARISON EXAMPLE 1

In each of the Examples 1 through 6, a photosensitive coating solution was prepared from the following composition.

| Composition of photosensitive coating solution | |
|---|---|
| 1-azidopyrene | 2 parts by weight |
| Novolak resin shown in Table 2 | 10 parts by weight |
| Ethyleneglycol monoethyl ether | 100 parts by weight |

The coating solution was applied onto one surface of a zinc plate by using a whirler rotating at 60 r.p.m. The coated layer of the solution was dried at a temperature of 80° C. in an air-blowing oven to form a photosensitive coating layer having a thickness of 3 microns. A photosensitive plate was obtained.

A piece of Step Tablet No. 2, made by Eastman Kodak Co., was placed on the photosensitive coating layer, and the photosensitive coating layer was exposed, through the piece of Step Tablet No. 2, to actinic rays from a 2 KW super voltage mercury lamp, spaced 1 m from the Step Tablet, for 70 seconds. The exposed photosensitive coating layer was developed with an aqueous solution of sodium hydroxide contained in a vatting developing device. The concentration of the sodium hydroxide solution was adjusted to such an extent that the minimum developing time required to complete the removal of the non-exposed portion of the photosensitive coating layer became exactly 60 seconds. The number of remaining steps in the developed layer was determined after the development.

The developing operation was extended to times of twice, three times, four times and five times the minimum developing time mentioned above. When each extended developing operation was completed, the number of remaining steps in the developed layer was determined.

In Comparison Example 1, the same procedures as those mentioned in Example 1 were carried out, except that a conventional m-cresol novolak resin was used.

The results of the Examples 1 through 6 and Comparison Example 1 are shown in Table 2.

Table 2

| Example No. | Novolak resin | Minimum developing time (60 sec) | Twice minimum developing time | Three times minimum developing time | Four times minimum developing time | Five times minimum developing time |
|---|---|---|---|---|---|---|
| | | \multicolumn{5}{c}{Number of remaining steps / Developing time} | | | | |
| Example 1 | Prepared in Referential Example 1 | 13 | 10.5 | 9.5 | 9 | 8.5 |
| Example 2 | Prepared in Referential Example 2 | 12 | 8.5 | 7.5 | 6.5 | 5.5 |
| Example 3 | Prepared in Referential Example 3 | 12.5 | 9.5 | 8.5 | 8 | 7.5 |
| Exaple 4 | Prepared in Referential Example 4 | 12.5 | 10 | 9 | 8.5 | 8 |
| Example 5 | Prepared in Referential Example 5 | 12.5 | 9.5 | 8.5 | 8 | 7.5 |
| Example 6 | Prepared in Referential Example 5 | 12.5 | 9 | 8 | 7 | 6.5 |
| Comparison Example 1 | m-cresol novolak resin | 11.5 | 6.5 | 5.5 | 4.5 | 3.5 |

Table 2 clearly shows that the photosensitive coating layers prepared from the photosensitive compositions of the present invention each has an increased photosensitivity which is about 2 through about 4 times that of the conventional photosensitive layer of Comparison Example 1. After exposure to actinic rays, the resultant hardened and insolubilized resin has a high resistance to the developing liquid. Therefore, the development of the photosensitive layer of the present invention can be carried out over a wide scope of developing conditions.

It was confirmed that the photosensitive coating layers of Examples 1 through 6 were very stable, so that even after six months of storage, there was no change in the photosensitivity and developing property thereof. For example, when photosensitive coating layer of Example 1 was exposed imagewise to actinic rays just after the preparation thereof, the developing time in which the removal of the non-exposed portion of the coating layer could be completed, was 60 seconds. Compared with this, when the same photosensitive coating layer, as that mentioned above, was exposed to actinic rays under the same conditions as mentioned above six months after the preparation thereof, the developing time was 66 seconds. That is, it is obvious that the photosensitivity and developing property of the photosensitive coating layer did not substantially change even during the six months of storage. The same result as that mentioned above was confirmed in the storage test on the photosensitive coating layer of Example 2.

For the purpose of comparison, the same storage test as that mentioned above was applied to a comparative photosensitive coating layer which had been prepared by using a novolak resin consisting of a condensation product of formaldehyde, phenol and cardanol, which contained a double bond. When the photosensitive coating layer was exposed imagewise to actinic rays just after the preparation thereof, the developing time for the exposed coating layer was 50 seconds. However, after the same comparative photosensitive layer was stored for one month, the developing time was 200 seconds, which is four times the above-mentioned 50 seconds.

From the above-stated facts, it is evident that the photosensitive composition of the present invention and the photosensitive coating layer prepared therefrom are extremely stable over a long storage time.

EXAMPLES 7 THROUGH 11 AND COMPARISON EXAMPLE 2

In each of Examples 7 through 11, the same procedures as those mentioned in Example 1 were carried out, except that, in place of the p-tert-octylphenol in the novolak resin used in Example 1, p-tert-nonylphenol was used in a content indicated in Table 3.

In Comparison Example 2, the same procedures as those in Examle 7 were carried out, except that no p-tert-nonylphenol was used.

The results of Examples 7 through 11 and Comparison Example 2 are shown in Table 3.

Table 3

| Example No. | Content of p-tert-nonylphenol (%) | Minimum developing time (60 sec) | Twice minimum developing time | Three times minimum developing time | Four times minimum developing time | Five times minimum developing time |
|---|---|---|---|---|---|---|
| | | \multicolumn{5}{c}{Number of remaining steps / Developing time} | | | | |
| Comparison example 2 | 0 | 10.5 | 6 | 4.5 | 3.5 | 2.5 |
| Example 7 | 20 | 11.5 | 8 | 6 | 5 | 4.5 |
| Example 8 | 40 | 12 | 9 | 8 | 7 | 6.5 |
| Example 9 | 50 | 13 | 10.5 | 9.5 | 9 | 8.5 |

EXAMPLES 12 THROUGH 14 AND COMPARISON EXAMPLE 3

In Examples 12 and 13, the same procedures as those mentioned in Examples 1 and 4, respectively, were carried out, except that 2-(4'-methoxyanilino)-5-azidobenzoic methyl ester was used in place of 1-azidopyrene.

In Example 14, the same procedures as those mentioned in Example 1 were effected, except that the novolak resin prepared in Referential Example 7 and 2-(4'-methoxyanilino)-5-azidobenzoic methyl ester were used in place of the novolak of Referential Example 1 and the 1-azidopyrene, respectively.

In Comparison Example 3, the same procedures as those mentioned in Comparison Example 1 were carried out, except that 2-(4'-methoxyanilino)-5-azidobenzoic methyl ester was used instead of the 1-azidopyrene.

The results of Examples 12 through 14 and Comparison Example 3 are shown in Table 4.

Table 4

| Example No. | Novolak resin | Number of remaining steps Developing time | | | | |
|---|---|---|---|---|---|---|
| | | Minimum developing time (60 sec) | Twice minimum developing time | Three times minimum developing time | Four times minimum developing time | Five times minimum developing time |
| Example 12 | Prepared in Referential Example 1 | 12.5 | 10 | 9 | 8.5 | 8 |
| Example 13 | Prepared in Referential Example 4 | 12 | 9.5 | 8.5 | 8 | 7.5 |
| Example 14 | Prepared in Referential Example 7 | 11.5 | 9 | 8 | 7.5 | 7 |
| Comparison Example 3 | m-cresol novolak resin | 11 | 6 | 5 | 4 | 3 |

Tables 3 and 4 clearly show that the photosensitive composition of the present invention has an excellent photosensitivity, and the hardened and insolubilized resin from the photosensitive composition of the present invention has a very high resistance to the developing liquid. That is, the photosensitive composition of the present invention can be stably developed over a wide scope of developing conditions.

What we claim is:

1. A photosensitive composition comprising (A) at least one polymer which is soluble in an alkali aqueous solution and which has been prepared by co-condensation polymerizing, in the presence of an acid catalyst, formaldehyde with a phenol compound of the formula (I):

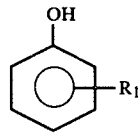

wherein, $R_1$ represents a hydrogen atom or a methyl radical, and, at least one other phenol compound selected from those of the formulae (II) and (III):

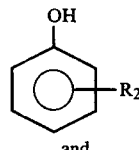

and

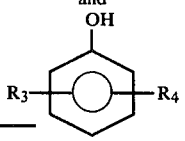

wherein, $R_2$ represents an alkyl radical having 3 to 15 carbon atoms, a phenyl radical or a cyclohexyl radical, and $R_3$ and $R_4$ represent an alkyl radical having 1 to 3 carbon atoms, respectively, the ratio by weight of the phenol compound of the formula (I) to said at least one other phenol compound selected from those of the formulae (II) and (III) being in a range of from 90:10 to 30:70, and the amount of said formaldehyde being in a range of from 50 to 90% by mole, based on the total amount of said phenol compound of the formula (I) and said at least one other phenol compounds selected from those of the formulae (II) and (III), and (B) at least one aromatic azido compound having a (—$N_3$) moiety in an amount of from 5 to 40% based on the weight of said polymer.

2. A photosensitive composition as claimed in claim 1, wherein said phenol compound of the formula (I) is either phenol or cresol.

3. A photosensitive composition as claimed in claim 1, wherein said other phenol compound of the formula (II) is selected from phenylphenol, cyclohexylphenol, isopropylphenol, p-tert-butylphenol, p-n-butylphenol, p-tert-amylphenol, p-n-amylphenol, p-tert-octylphenol, p-n-octylphenol, p-nonylphenol, p-dodecylphenol, hexylphenol and m-pentadecylphenol.

4. A photosensitive composition as claimed in claim 1, wherein said other phenol compound of the formula (III) is selected from 2,4-xylenol, 3,4-xylenol, 3,5-xylenol carvacrol and thymol.

5. A photosensitive composition as claimed in claim 1, wherein said aromatic azido compound is selected from 4,4'-diazidostilbene, 4,4'-diazidochalcone, 4,4'-diazidobenzophenone, 2,6-bis(4'-azidobenzylidene)cyclohexanone, 1-azidopyrene, 1,6-diazidopyrene, 2-(4'-methoxyanilino)-5-azidobenzoic methyl ester, 2-anilino-5-azidobenzoic acid, 2-(4'-azidophenyl)-6-methyl benzothiazole and 2-(4'-azidophenyl)-(naphtho-1',2'-4,5-oxazole).

* * * * *